United States Patent [19]

McIntosh et al.

[11] Patent Number: 5,684,309
[45] Date of Patent: Nov. 4, 1997

[54] STACKED QUANTUM WELL ALUMINUM INDIUM GALLIUM NITRIDE LIGHT EMITTING DIODES

[75] Inventors: Forrest Gregg McIntosh; Salah Mohamed Bedair; Nadia Ahmed El-Masry; John Claassen Roberts, all of Raleigh, N.C.

[73] Assignee: North Carolina State University, Raleigh, N.C.

[21] Appl. No.: 678,346

[22] Filed: Jul. 11, 1996

[51] Int. Cl.$^6$ .................................................. H01L 29/205
[52] U.S. Cl. .......................... 257/191; 257/14; 257/101; 257/103; 257/96; 257/97; 257/94; 257/185
[58] Field of Search ........................ 257/13, 191, 12, 257/14, 79, 94, 95, 96, 97, 101, 103

[56] References Cited

U.S. PATENT DOCUMENTS

| | | | |
|---|---|---|---|
| 4,862,471 | 8/1989 | Pankove | 257/191 |
| 4,916,708 | 4/1990 | Hayakawa | 257/191 |
| 4,941,025 | 7/1990 | Tabatabaie | 257/14 |
| 5,077,588 | 12/1991 | Yamada et al. | 257/101 |
| 5,146,465 | 9/1992 | Khan et al. | 372/45 |
| 5,247,533 | 9/1993 | Okazaki et al. | 372/45 |
| 5,358,897 | 10/1994 | Valster et al. | 257/13 |
| 5,373,166 | 12/1994 | Buchan et al. | 257/96 |
| 5,392,306 | 2/1995 | Usami et al. | 257/101 |
| 5,400,352 | 3/1995 | Lebby et al. | 257/14 |
| 5,410,159 | 4/1995 | Sugawara et al. | 257/13 |
| 5,473,173 | 12/1995 | Takiguchi et al. | 257/97 |
| 5,523,589 | 6/1996 | Edmond et al. | 257/96 |
| 5,563,900 | 10/1996 | Ackley et al. | 257/97 |
| 5,578,839 | 11/1996 | Nakamura et al. | 257/101 |
| 5,585,648 | 12/1996 | Tischler | 257/77 |
| 5,587,593 | 12/1996 | Koide et al. | 257/96 |
| 5,592,501 | 1/1997 | Edmond et al. | 372/45 |

OTHER PUBLICATIONS

Jordan et al., "White Organic Electroluminescence Devices", Appl. Phys. Lett., vol. 68, No. 9, Feb. 26, 1996, pp. 1192–1194.

*Primary Examiner*—Tom Thomas
*Assistant Examiner*—David B. Hardy
*Attorney, Agent, or Firm*—Bell, Seltzer, Park & Gibson

[57] ABSTRACT

Stacked quantum well light emitting diodes include a plurality of stacked active layers of indium gallium nitride, separated by barrier layers of aluminum gallium nitride or aluminum indium gallium nitride, wherein the ratios of indium to gallium differ in at least two of the stacked active layers. Preferably, the differing ratios of indium to gallium are selected to produce emission wavelengths from the stacked active layers, such that the emission wavelengths are combined to produce white light. Controlled amounts of hydrogen gas are introduced into a reaction chamber during formation of indium gallium nitride or aluminum indium gallium nitride to produce high quality indium gallium nitride or aluminum indium gallium nitride which incorporate large percentages of indium and possesses excellent optical and surface properties.

26 Claims, 8 Drawing Sheets

STACKED QUANTUM WELL ALUMINUM INDIUM GALLIUM NITRIDE LIGHT EMITTING DIODES

GOVERNMENT RIGHTS

This invention was made with Government Support under Grant Number N00014-92-J-1477 awarded by the Department of the Navy. The Government has certain rights in the invention.

FIELD OF THE INVENTION

This invention relates to microelectronic devices and fabrication methods, and more particularly to light emitting diodes and fabrication methods therefor.

BACKGROUND OF THE INVENTION

Light emitting diodes (LEDs) are widely used in optical displays, traffic lights, data storage, communications, medical applications and many other applications. Generally however, light emitting diodes emit light of only one color. For example, light emitting diode displays typically include light emitting diodes for each picture element (pixel) which emit light in the blue, green and red spectrums. Unfortunately, the general need for separate blue, green and red LEDs can limit the resolution of the LED display because of limits on how small the individual LEDs can be made. Moreover, for large LEDs, separate red, green and blue LEDs generally preclude the use of LEDs as a white light because the LEDs are perceived as separate red, green and blue LEDs. Accordingly, the LED has not generally been available as a replacement for white light sources such as incandescent and fluorescent lamps.

Attempts have been made to produce solid state white light sources. See for example, the publication entitled *"White Organic Electroluminescense Devices"* by Jordan et al., Applied Physics Letters, Vol. 68, No. 9, pp. 1192–1194, Feb. 26, 1996. In this publication, thin film organic electroluminescent devices are described which employ a blue-emitting species as a layer sandwiched between the hole transporter bis(triphenyl)diamine and the light emitting electron transporter tris(8-hydroxyquinoline)aluminum to obtain bright efficient white emission. Unfortunately, the use of exotic organic materials may not be compatible with conventional microelectronic devices and fabrication processes which generally use semiconductor materials.

SUMMARY OF THE INVENTION

It is therefore an object of the present invention to provide improved light emitting diodes and fabrication methods therefor.

It is another object of the invention to provide light emitting diodes which are capable of emitting white light, and methods of fabricating same.

It is yet another object of the present invention to provide semiconductor light emitting diodes which are capable of emitting white light, and methods of fabricating same.

It is still another object of the present invention to provide methods of fabricating semiconductor thin films which may be used in semiconductor light emitting diodes and other devices.

These and other objects are provided, according to the present invention, by a stacked quantum well light emitting diode which includes a plurality of stacked active layers of indium gallium nitride, separated by barrier layers of aluminum gallium nitride or aluminum indium gallium nitride, wherein the ratios of indium to gallium differ in at least two of the stacked active layers. Preferably, the differing ratios of indium to gallium are selected to produce emission wavelengths from the stacked active layers, such that the emission wavelengths combine to produce white light.

It has been found, according to the invention, that the aluminum indium gallium nitride material system possesses energy bandgaps which can be tailored over wavelengths which range from the far ultraviolet to the red region of the electromagnetic spectrum. To the best of the inventors' knowledge, no other semiconductor material system has this unique property.

In a preferred embodiment of the present invention, a quantum well light emitting diode includes a first barrier layer comprising aluminum indium gallium nitride or aluminum gallium nitride, and a first active layer comprising indium gallium nitride on the first barrier layer. A second barrier layer comprising aluminum indium gallium nitride or aluminum gallium nitride is on the first active layer. A second active layer comprising indium gallium nitride is on the second barrier layer, and a third barrier layer comprising aluminum indium gallium nitride or aluminum gallium nitride, is on the second active layer. As used herein, when a layer is "on" another layer, it may be directly on the other layer, or intervening layers may be present.

The first and second active layers include different ratios of indium to gallium. Preferably, the first active layer includes a first ratio of indium to gallium and the second active layer includes a second ratio of indium to gallium, and the first and second ratios are selected to produce corresponding first and second emission wavelengths from the first and second active layers, such that the first and second emission wavelengths combine to produce white light. Thus, two emission wavelengths may be selected to produce white light.

In a second embodiment of the present invention, three active layers are used to produce white light, for example active layers which emit in the red, blue and green spectral regions. Thus, a second embodiment of the present invention includes a third active layer comprising indium gallium nitride on the third barrier layer, and a fourth barrier layer comprising aluminum indium gallium nitride or aluminum gallium nitride on the third active layer. The first, second and third active layers include different ratios of indium to gallium.

In the first and second embodiments, biasing means are provided to bias the light emitting diode so that the first and second active layers, and third active layer if present, produce corresponding first and second (and third) emission wavelengths. It will also be understood that more than three active layers may be used.

In other embodiments of the present invention, the stacked quantum well aluminum indium gallium nitride light emitting diode includes means, such as individual ohmic contacts, for individually biasing the first and second (and third) active layers, so that the first, second (and third) active layers produce corresponding first and second (and third) emission wavelengths which can vary in intensity as a function of the individual biases on the first and second (and third) active layers. Individual active layer biasing may be used to spectrally tailor the white light to more readily emulate an incandescent or fluorescent bulb or sunlight, or to vary the emission intensity and/or frequency from one color to another to provide changing colors.

Light emitting diodes according to the invention are preferably fabricated such that the first barrier layer is on a substrate. The first barrier layer is preferably doped a first conductivity type and the third barrier layer is preferably doped a second conductivity type to provide a p-i-n diode. The one or more of the active layers and barrier layers may also be doped p or n conductivity type. A buffer layer may be included between the substrate and the first barrier layer.

Light emitting diodes according to the present invention are preferably arranged so that wavelengths emitted by the lower active layers, adjacent the substrate, are not absorbed by the upper active layers, remote from the substrate, during emission. Accordingly, if the first active layer has a first ratio of indium to gallium, the second active layer has a second ratio of indium to gallium and the third active layer has a third ratio of indium to gallium, the first ratio is preferably greater than the second ratio and the second ratio is preferably greater than the third ratio. Thus, at least two of the stacked active layers have decreasing ratios of indium to gallium from adjacent the substrate to opposite the substrate.

A major problem heretofore encountered in fabricating aluminum indium gallium nitride films and devices has been the incorporation of indium into these alloys. In particular, it has heretofore been difficult to produce indium gallium nitride or aluminum indium gallium nitride using conventional Metal Organic Chemical Vapor Deposition (MOCVD), wherein a large percentage of indium is incorporated and the film or device exhibits high quality optical and surface properties.

According to the invention, it has unexpectedly been found that during the MOCVD process, when controlled amounts of hydrogen gas are introduced into the reaction chamber, high quality indium gallium nitride or aluminum indium gallium nitride films may be formed, which incorporate indium percentages of 65% or more, with excellent optical and surface properties. Accordingly, indium gallium nitride or aluminum indium gallium nitride is formed in a deposition chamber by flowing precursors of indium gallium nitride or aluminum indium gallium nitride in the reaction chamber in the presence of hydrogen gas. In one embodiment, hydrogen is flowed as a carrier gas for at least one of the precursors of indium gallium nitride or aluminum indium gallium nitride in the reaction chamber. In another embodiment, the precursors of indium gallium nitride or aluminum indium gallium nitride are flowed in the reaction chamber in a non-hydrogen carrier gas, such as nitrogen, and hydrogen gas is flowed in the chamber in a gas flow which is separate from the flow of the precursors of indium gallium nitride or aluminum indium gallium nitride.

The amount of hydrogen gas is sufficient to produce indium gallium nitride or aluminum indium gallium nitride having optical emission properties but is not so excessive as to retard incorporation of indium into indium gallium nitride or aluminum indium gallium nitride. In particular, it has been found that if hydrogen gas is not used, the indium gallium nitride or aluminum indium gallium nitride films have poor surface morphology and poor optical properties. If excessive hydrogen is used, then the grown films have little or no indium incorporation, regardless of the indium precursor flow rate. However, controlled hydrogen flow rates produce indium gallium nitride or aluminum indium gallium nitride films which have excellent optical properties and good surface morphology.

In an embodiment of the present invention, the precursor of indium and hydrogen are flowed through the deposition chamber, with the flow rate of hydrogen preferably between 4 and 80 standard cubic centimeters per minute (sccm). In this range, it has been found that increased amounts of hydrogen decreases the amount of indium which is incorporated into the alloy and vice versa. It will be understood, however, that the specific values of flow rates may depend on the deposition chamber "fingerprint", and may vary from chamber to chamber. Accordingly, high quality aluminum indium gallium nitride or indium gallium nitride films may be grown for use in stacked quantum well light emitting diodes or other devices which include the aluminum indium gallium nitride materials set.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as p- or n-type, however, each embodiment described and illustrated herein includes its complementary embodiment as well.

FIGS. 1–4 illustrate first through fourth embodiments of stacked quantum well aluminum indium gallium nitride light emitting diodes according to the present invention. As will be shown, each light emitting diode includes a plurality of stacked active layers of indium gallium nitride separated by barrier layers of aluminum indium gallium nitride or aluminum gallium nitride wherein the ratios of indium to gallium differ in at least two of the stacked active layers.

Figure 1:
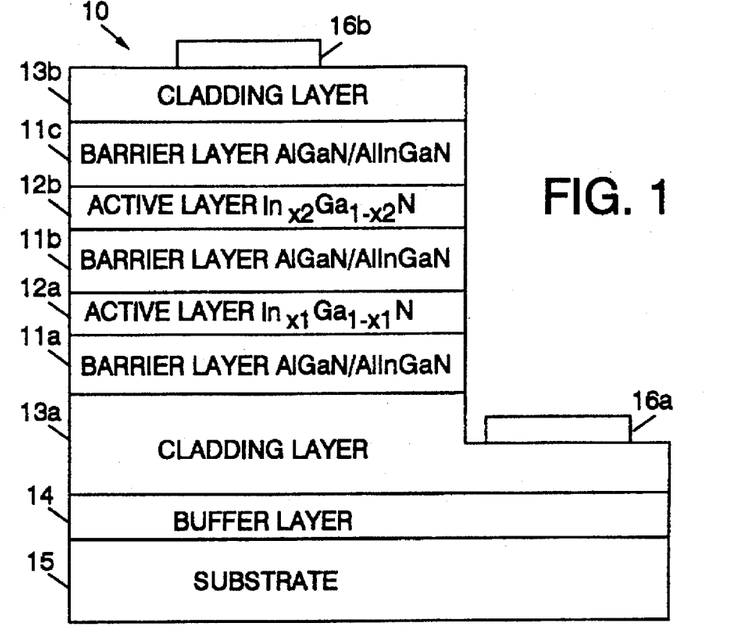
FIGS. 1 through 4 illustrate first through fourth embodiments of stacked quantum well aluminum indium gallium nitride light emitting diodes according to the present invention.

Referring now to FIG. 1, quantum well light emitting diode 10 includes two quantum well active layers 12a and 12b. Quantum well active layer 12a and 12b are formed of indium gallium nitride with differing ratios of indium to gallium. In particular, first active layer 12a is formed of $In_{x1}Ga_{1-x1}N$ and second active layer 12b is formed of $In_{x2}Ga_{1-x2}N$, where $0<x1<1$ and $0<x2<1$ and $x1 \neq x2$. The first and second active layers 12a and 12b are separated by first, second and third barrier layers 11a, 11b and 11c respectively. The barrier layers 11a, 11b and 11c may be formed of aluminum gallium nitride or aluminum indium gallium nitride.

Still continuing with the description of FIG. 1, first and second cladding layers 13a, respectively, surround the stacked quantum well structure. The cladding layers may be oppositely doped gallium nitride, aluminum gallium nitride, aluminum indium gallium nitride or other cladding layers. First and second ohmic contacts 16a, 16b respectively, electrically contact first and second cladding layers 13a, 13b to provide means for biasing the light emitting diode so that the first and second active layers produce corresponding first and second emission wavelengths.

Device 10 is preferably formed on a substrate 15 such as sapphire substrate. A buffer layer 14 such as an aluminum nitride buffer layer may be used to absorb lattice and thermal mismatches between the substrate and the remainder of the device.

Still referring to FIG. 1, it can be seen that the first active layer has a first ratio of indium to gallium x1/1−x1 and the second active layer has a second ratio of indium to gallium x2/1−x2. The first and second ratios are preferably selected to produce corresponding first and second emission wavelengths from the first and second active layers. The emission wavelengths may be combined to produce white light if appropriate emission wavelengths are selected and combined, as described below.

Still referring to FIG. 1, in order for the first active layer 12a to produce a wavelength of light which is not absorbed by the second active layer 12b, the first ratio or indium to gallium in the first active layer 12a is preferably greater than the second ratio of indium to gallium in the second active layer 12b. However, the first ratio need not be greater than the second ratio. Thus, wavelengths produced by layer 12a will pass through layer 12b without substantial absorption and will be emitted from the device 10.

Figure 2:
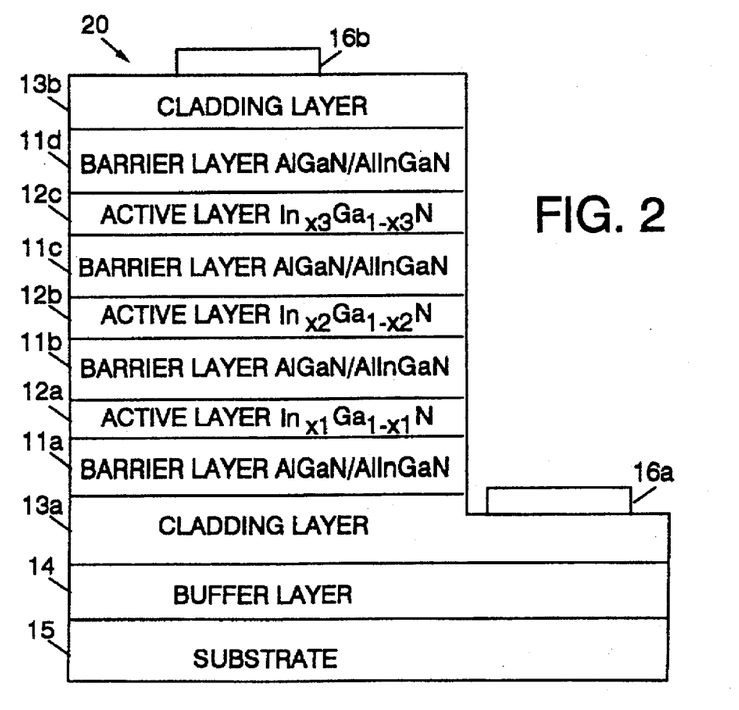

Referring now to FIG. 2, a second embodiment of a quantum well light emitting diode according to the present invention is illustrated. In quantum well 20 of FIG. 2, three active layers 12a, 12b and 12c separated by four barrier layers 11a, 11b, 11c and 11d are shown. In many applications, it may be easier to produce white light and/or to spectrally tailor the white light emission over a wide range by using three separate quantum wells. Accordingly, device 20 includes a third active layer 12c which comprises $In_{x3}Ga_{1-x3}N$ on the third barrier layer 11c and a fourth barrier layer comprising aluminum indium gallium nitride or aluminum gallium nitride on the third active layer 12c.

The first, second and third active layers 12a, 12b and 12c respectively, preferably include different ratios of indium to gallium, i.e. X1–x2–x3. The ratios are preferably selected to produce corresponding first, second and third emission wavelengths from the first, second and third active layers, such that the first, second and third emission wavelengths combine to produce white light. As already described with respect to FIG. 1, the third active layer preferably has a third ratio of indium to gallium x3/1−x3 which is less than the second ratio, so that the first ratio is greater than the second ratio, and the second ratio is greater than the third ratio. However, these ratio differences are not required.

Figure 3:
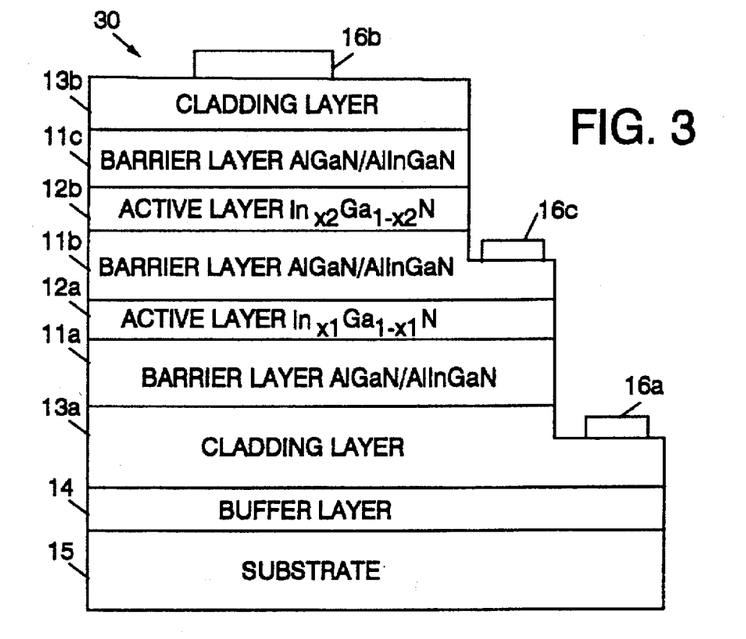
Figure 4:
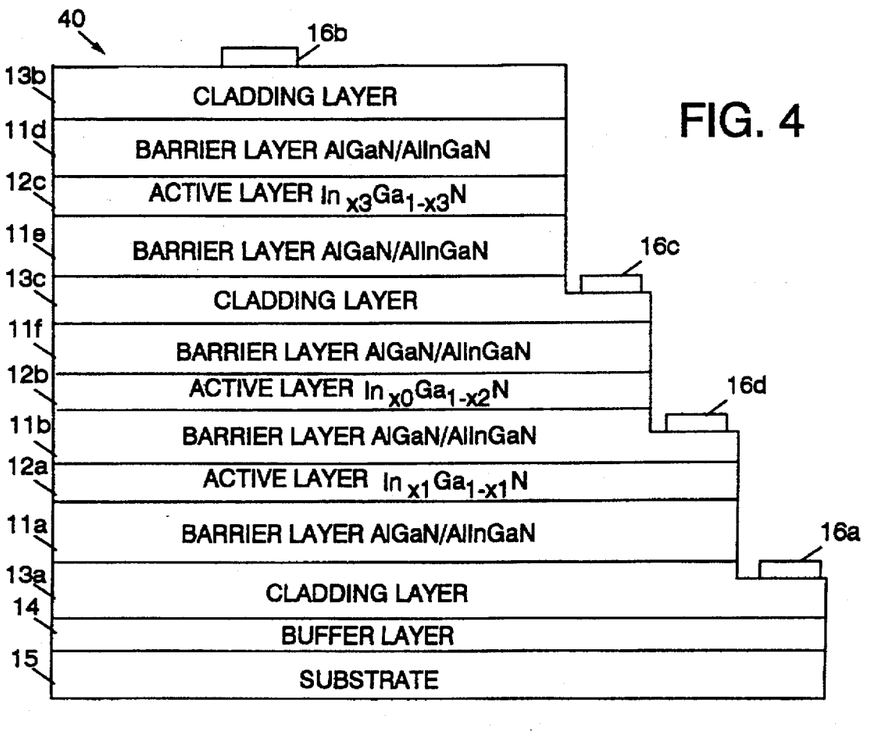

FIGS. 3 and 4 illustrate quantum well light emitting diodes having two and three active layers respectively, similar to the quantum well light emitting diodes 10 and 20 of FIGS. 1 and 2 respectively. However, FIGS. 3 and 4 add means for individually biasing the first and second active layers (FIG. 3) or the first, second and third active layers (FIG. 4) to produce corresponding first and second emission wavelengths (FIG. 3) or first, second and third wavelengths (FIG. 4) which vary in intensity as a function of the individual bias in the first and second active layers. Accordingly, the spectrum of the emitted light may be tailored, for example to resemble white light produced by an incandescent lamp, a fluorescent lamp or sunlight.

In particular, referring to FIG. 3, a third ohmic contact 16c electrically contacts second barrier layer 11b. In FIG. 4, a third ohmic contact electrically connects a third cladding layer 13c and two additional barrier layers 11f and 11e surround cladding layer 13c. A fourth ohmic contact 16d electrically contacts second barrier layer Accordingly, individual biases may be applied using ohmic contacts 16a–16c (FIG. 3) or 16a–16d (FIG. 4) to individually tailor the emission intensity and/or frequency of the individual active layers.

A general discussion of the operation of the stacked quantum well light emitting diodes 10, 20, 30 and 40 of FIGS. 1–4 respectively will now be provided. The devices of FIGS. 1–4 produce p-n junction or p-i-n junction LEDs that can emit white light or any other color of light under forward bias. Under forward bias, electrons are injected from the n region to the p region and holes are injected from the p region to the n region of the device. With the proper choice of barrier thicknesses, as will be described in connection with detailed examples below, a significant fraction of the electrons and holes will recombine in the quantum well active layers and emit photons of the proper wavelengths and proper intensities. When combined after exiting the device, these photons can yield white light as perceived by the human eye.

It will be understood that in the devices shown in FIGS. 1 and 2, changing the biasing generally changes the emission intensity of all of the quantum wells simultaneously. For the devices shown in FIGS. 3 and 4, a complete range of colors can be achieved as a continuum. Unfortunately, the devices of FIGS. 3 and 4 may require a greater number of processing steps, and it may be more difficult to form multiple contacts per device rather than a pair of contacts per device.

Many different systems have been used to describe the visible color spectrum as perceived by the human eye. The most widely accepted standard is the CIE-LAB chromaticity diagram shown in FIG. 5. This diagram is commonly used both for matching of colors and for determining the results of mixing of additive colors, i.e. light of different wavelengths. Single frequency light sources such as lasers, or narrow frequency sources such as LEDs, lie on the outside edge of this diagram along the horseshoe border. Typically, to form white light, three different colors are used which form a triangle on the chromaticity diagram of FIG. 5. Any color within this triangle can be created by mixing of the three "primary colors". This is the underlying theory behind color television and color displays.

Figure 5:
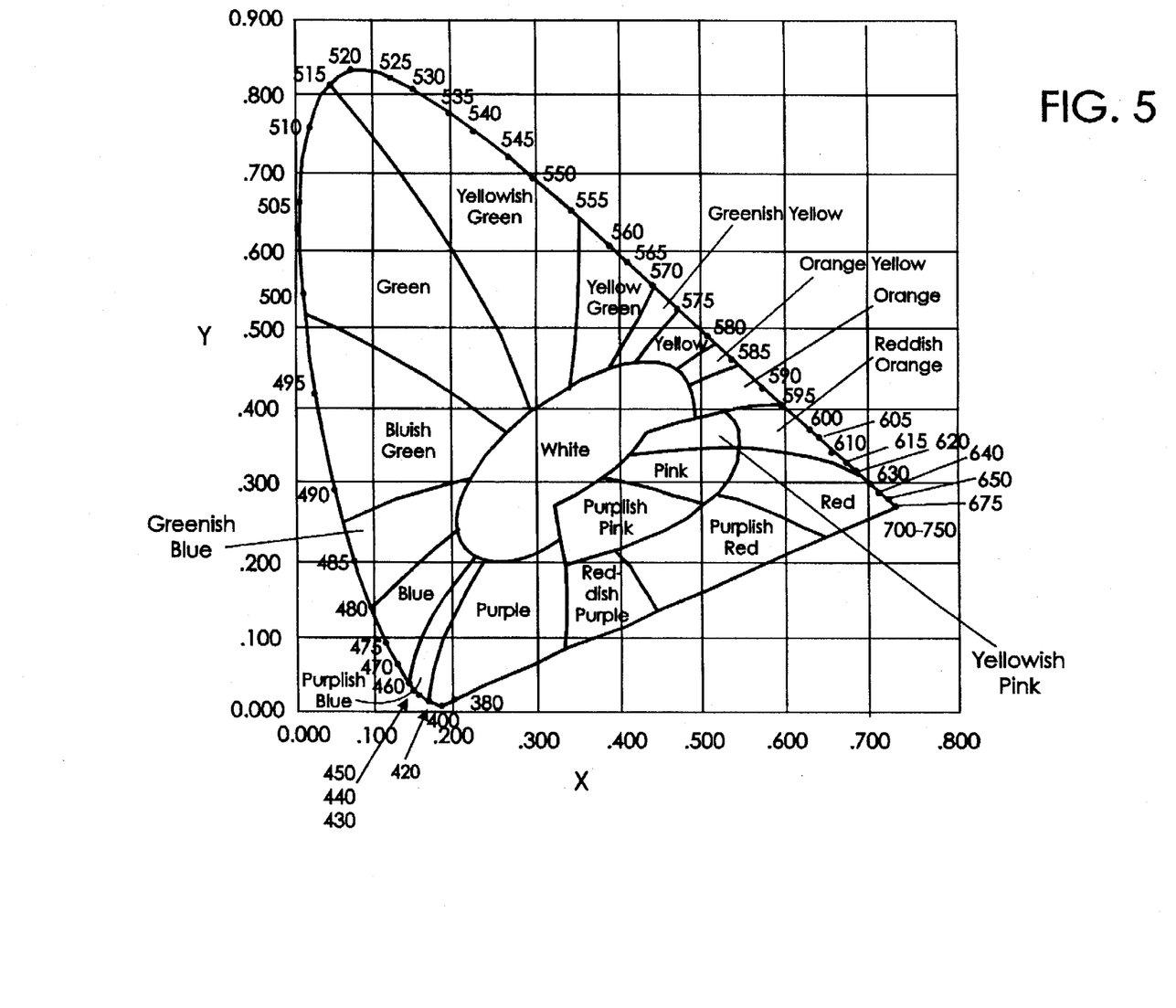
FIG. 5 is a chromaticity diagram.

Accordingly, devices according to the present invention can be used to produce virtually any color on the diagram. Moreover, devices according to the invention can cover more of the spectrum than a standard CRT technology. It will be understood that in order to produce any desired color, such as white light, any two colors can also be used, as long as the line on the chromaticity diagram connecting the two colors also crosses the "white" region, and the relative intensities are properly adjusted. An advantage of this white light source over typical incandescent and fluorescent sources is that the two primary colors can be selected to give a hue which more closely resembles sunlight.

Referring now to FIGS. 6, 7, 8 and 9, specific examples 10', 20', 30' and 40', of quantum well light emitting diode structures 10, 20, 30 and 40 of FIGS. 1–4 respectively are illustrated. It will be understood that these examples are provided for purposes of illustration and should not be deemed as limiting the present invention.

Figure 6:
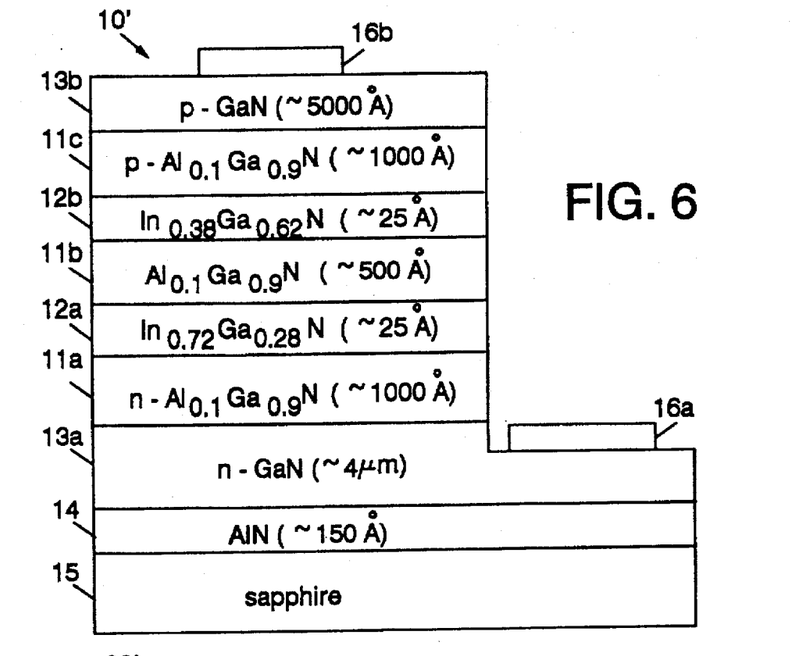
FIGS. 6 through 9 illustrate specific examples of light emitting diode structures corresponding to FIGS. 1–4 respectively.

As shown in FIG. 6, a device 10' is shown with specific layer thicknesses and alloy concentrations. As shown, substrate 15 is a sapphire substrate and buffer layer 14 is a 150Å thick aluminum nitride buffer layer. First cladding layer 13a is a 4 μm thick n-type gallium nitride layer, and second cladding layer 13b is a 5000Å p-type gallium nitride layer. Barrier layers 11a, 11b and 11e are $Al_{0.1}Ga_{0.9}N$, having thicknesses of 1000Å, 500Å and 1000Å respectively. First active layer 12a is $In_{0.72}Ga_{0.28}N$ and second active layer 12b is $In_{0.38}Ga_{0.62}N$. As shown, both layers are about 25Å thick.

Figure 10:
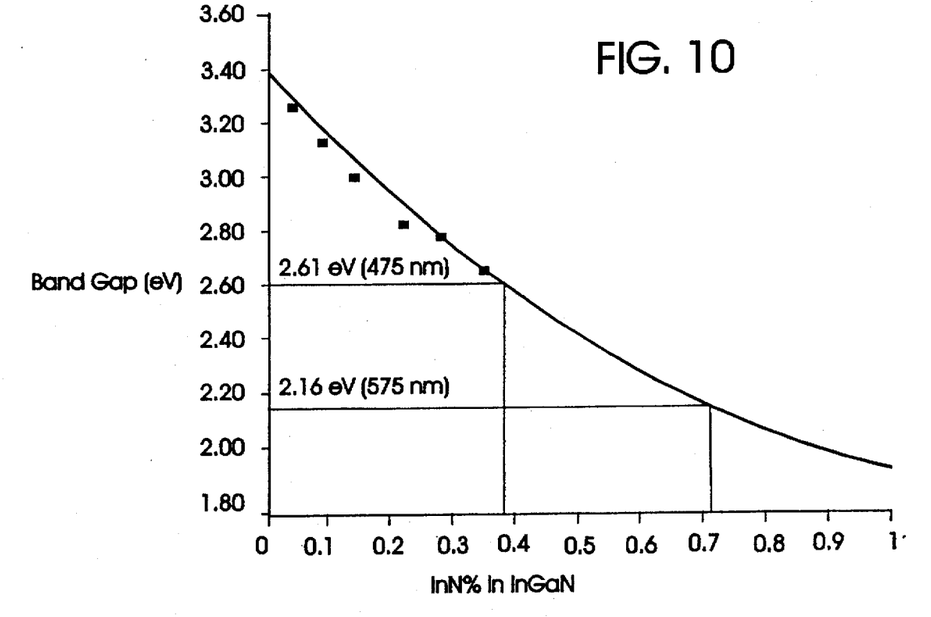
FIG. 10 graphically illustrates indium gallium nitride alloy compositions for FIGS. 6 and 8.

FIG. 10 graphically illustrates the indium gallium nitride alloy compositions in the active layers 12a, 12b and the emitted wavelength which corresponds to the bandgaps in electron volts. Thus, as shown in FIG. 10, first bandgap layer 12a has 72% (0.72) indium and produces a bandgap of 2.16 eV and an emission wavelength of 575 nm. Second barrier layer 12b has an indium percentage of 38% (0.38) to produce a bandgap of 2.61 eV and an emission wavelength of 475 nm. Referring back to the chromaticity diagram of FIG. 5, these wavelengths can combine to produce white light.

The bandgaps of FIG. 10 are obtained by extrapolating experimental data shown in the black squares based on a theoretical analysis of the bandgap versus indium percentage. It will be understood by those having skill in the art that the values of x chosen are arbitrary because there can be an infinite number of wavelengths that can produce white light. Moreover, the intensities of the combined wavelengths are also important in producing white light. The devices described herein assume that each active layer emits the same intensity because they have equal thickness. The emitted intensity depends in part on active layer thickness, but other factors may also be involved.

Figure 7:
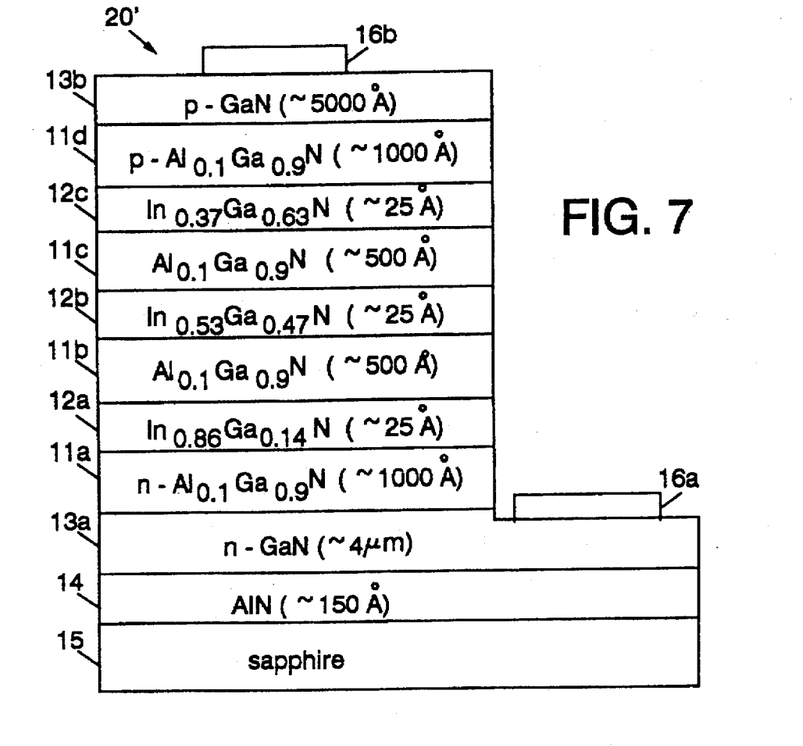
Figure 8:
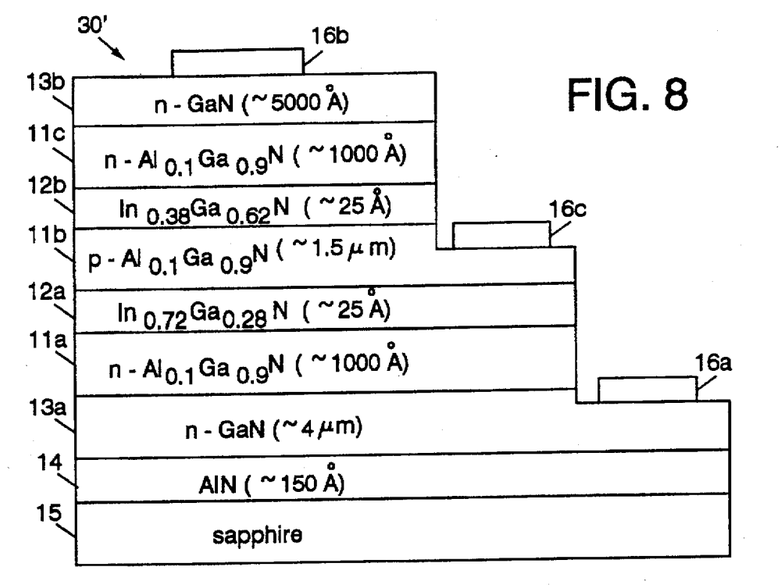
Figure 9:
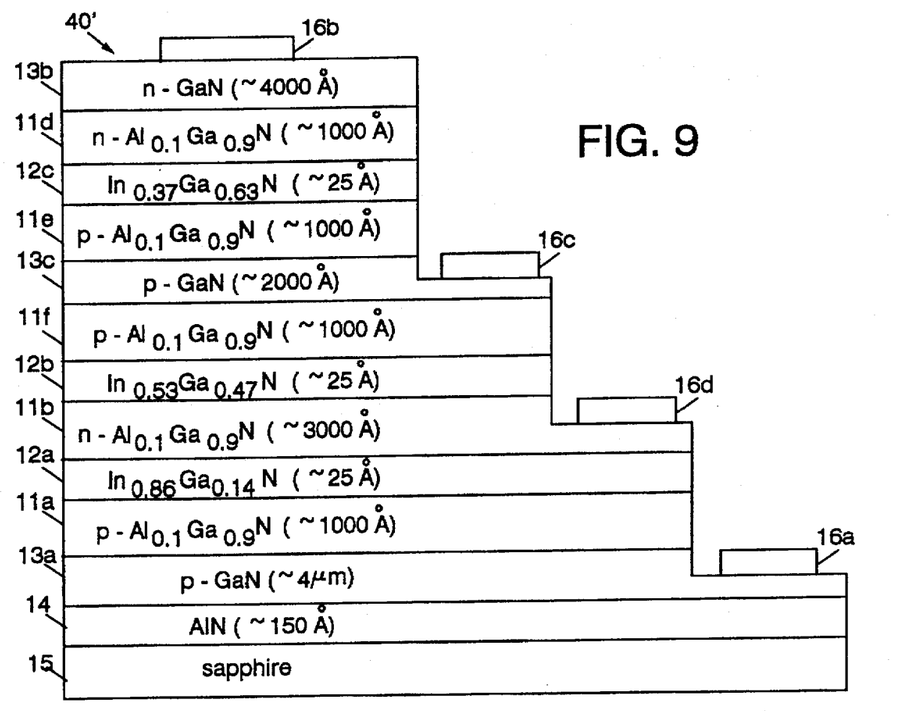
Figure 11:
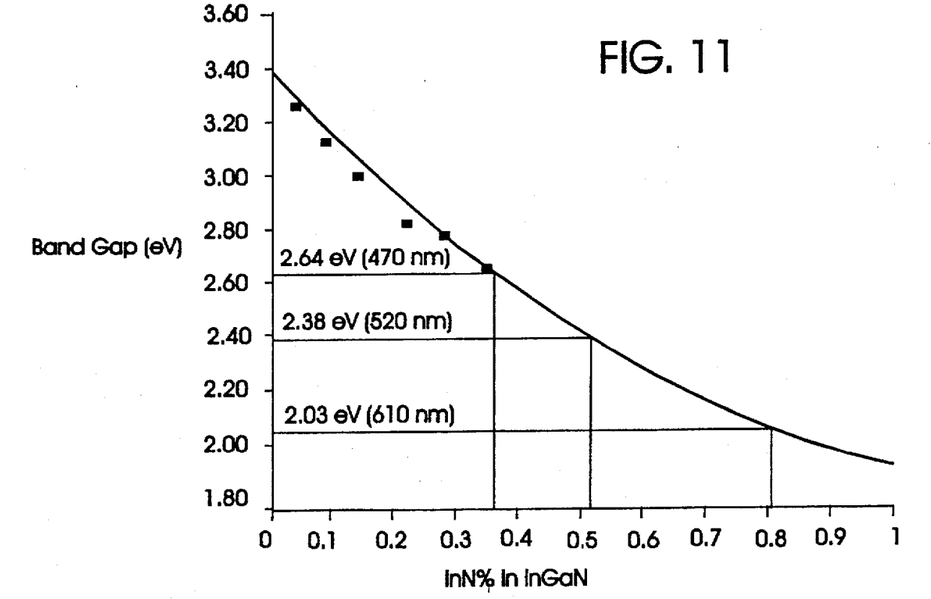
FIG. 11 graphically illustrates indium gallium nitride alloy compositions for FIGS. 7 and 9.

FIG. 7 illustrates a device 20' having three active layers 12a, 12b and 12c. FIG. 11 graphically illustrates the expected bandgaps and emission wavelengths for this device. FIG. 8 illustrates a two-active layer device 30' with individually biased active layers. FIG. 10 illustrates the bandgaps and expected emission wavelengths for the individual active layers of this device. Finally, FIG. 9 illustrates an individually biased three active layer device 40' similar to the device 40 of FIG. 4. FIG. 11 graphically illustrates the bandgaps and expected emission wavelengths for the individual active layers of the device.

It will be understood that the embodiments of FIGS. 3, 4, 8 and 9 may emit different intensities and/or frequencies of light by varying the bias on ohmic contacts 16d and 16e. It will also be understood by those having skill in the art that in all of the embodiments already described, the barrier layer may also be aluminum indium gallium nitride. Moreover, the cladding layers may also be aluminum gallium nitride, aluminum indium gallium nitride, gallium nitride or any other cladding layer which may be used Group III–V nitride compound semiconductor materials. Similarly, substrate 15 and buffer layer 14 may be any other substrate and buffer layer which may be used with Group III–V nitrides. Also, if the substrate is a conducting substrate, some ohmic contacts such as 16a, may be made directly to the substrate material.

Aluminum nitride buffer layer 14 may be grown using Atomic Layer Epitaxy (ALE) or MOCVD at low temperatures to accommodate the lattice mismatch and to produce flat surfaces. The lower cladding layer 13 may be graded, i.e. by continuously or discontinuously varying x and y in $In_xAl_yGa_{1-y-x}N$ or by varying x in $Al_xGa_{1-x}N$. The choices of x and y in the grading may depend on lattice matching and contact considerations. The choices of x and y for the barrier layers typically also generally depends on lattice matching considerations. The barrier layers, active layers and/or cladding layers may be doped p-type or n-type or may be intrinsic to form a p-n diode, a p-i-n diode or a plurality of serially connected diodes, as will be recognized by those having skill in the art.

It will also be understood that to achieve white emission, or other combinations of different colors, carrier collection and radiative recombination in the stacked quantum well structures may need to be adjusted to achieve the desired internal quantum efficiency for each quantum well. This may require fine tuning of the quantum well thickness and composition, the thickness of the barrier layers and other factors. This fine tuning process may be carried out experimentally and theoretically by using existing theoretical calculation models for carrier collection in quantum structures.

The efficiency of quantum well light emitting diodes according to the present invention is comparable with standard technologies. A rough comparison can be made by examination of the efficiencies of the two sources, i.e. the luminous intensity versus the input power. Typical incandescent tungsten lamp efficiencies range from 9 to 20 candella/watt. The efficiencies of conventional gallium nitride-based LEDs range from 4.8 to 14 candella/watt. Although a direct comparison may be difficult considering the many factors involved, especially the more limited viewing angle of LED devices, these efficiencies show that current gallium nitride-based LEDs are comparable with incandescent lamp technology. Moreover, considering that incandescent lamp technology is mature while gallium nitride technology is still new, further development will likely result in significant improvements in the efficiencies of light emitting diodes according to the present invention.

Methods of fabricating quantum well light emitting diodes according to the present invention will now be described. As is well known to those having skill in the art, Group III–V nitride semiconductor devices are typically fabricated using Molecular Beam Epitaxy (MBE) and Metal Organic Chemical Vapor Deposition (MOCVD). In conventional MBE or MOCVD, the Group III and Group V precursor gases generally flow simultaneously down to a heated substrate where a chemical reaction takes place to deposit the epitaxial film. MBE reactors are well known and are marketed by RIBER (France), EPI (US) and others. MOCVD reactors are well known and are marketed by Thomas Swarm (UK), Emcore (US), Aixtron (Germany) and others.

As already described with respect to FIGS. 1–4 and 6–9, quantum well light emitting diodes according to the invention include quantum well layers having controlled amounts of indium. The percentage of indium may be as high as 90% or more in order to obtain a desired frequency of emission. Unfortunately, heretofore it has been extremely difficult to obtain device quality indium gallium nitride or aluminum indium gallium nitride films using MBE or MOCVD techniques. Also, for high INN%, indium metal droplets can segregate at the interface between the InGaN active layer and the AlGaN or AlInGaN barrier layers. The presence of these In droplets can affect or even dominate the properties of these devices.

According to the invention, it has been discovered that when a controlled amount of hydrogen gas is flowed during MBE or MOCVD growth, high device quality films with high indium content may be required so that emission in the green, yellow and red regions may be obtained. Also, the presence of hydrogen appears to reduce In segregation at these interfaces. The absence of hydrogen generally results in poor and inadequate optical properties, and excessive hydrogen generally only allows low indium incorporation.

With the controlled hydrogen growth technique of the present invention, it has become possible to sequentially deposit multilayer electronic structures while still maintaining a high value of indium incorporation and excellent optical and surface properties. Such findings are striking and to the best of the inventors' knowledge, have no precedent in any other III-V compounds previously studied. If hydrogen is avoided, such as by using conventional nitrogen as a carrier gas, indium gallium nitride films with deep levels and poor optical properties are generally produced, which are not suitable for device applications.

Although the incorporation of hydrogen may be used to fabricate stacked quantum well LEDs according to the present invention, it may also be used to fabricate other indium-based nitride devices which are widely used for white, blue, green and yellow LEDs and other optoelectronic and electronic devices such as optical detectors and transistors. Accordingly, controlled hydrogen flow may be used to produce device quality III—V nitride films which include indium.

Figure 12:
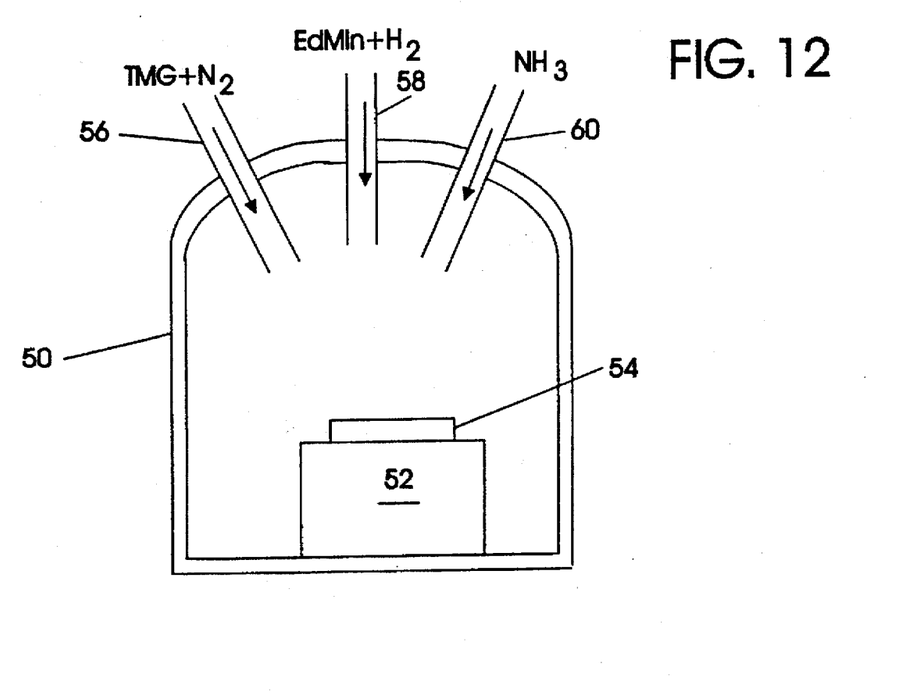
FIGS. 12 and 13 schematically illustrate cross-sectional views of Metal Organic Chemical Vapor Deposition systems (MOCVD).
Figure 13:
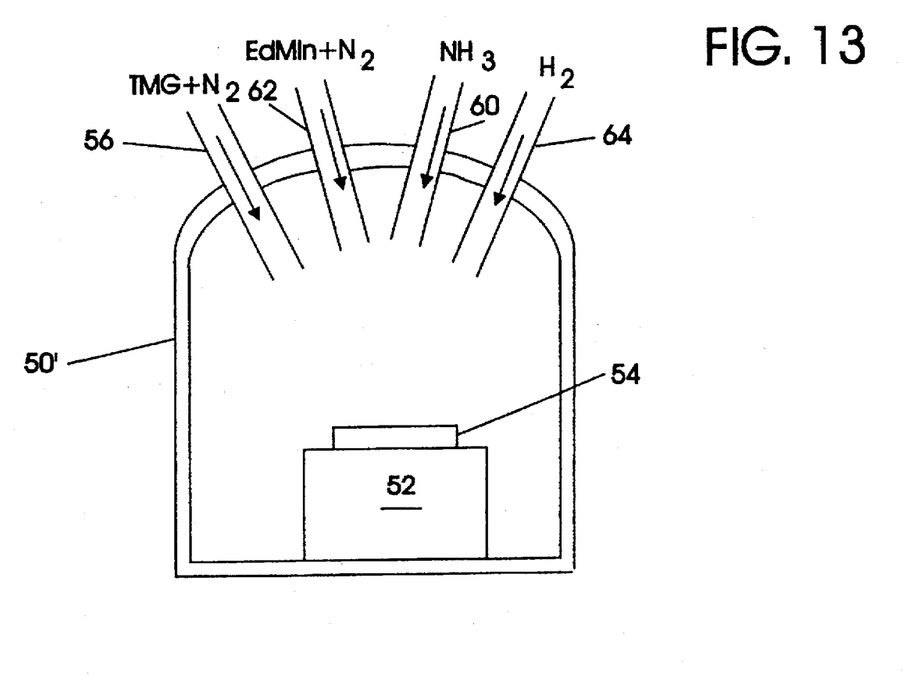

Two embodiments of methods of forming indium gallium nitride or indium aluminum gallium nitride films according to the invention are shown in FIGS. 12 and 13. FIGS. 12 and 13 are both highly schematic cross-sectional views of MOCVD systems including a reaction chamber 50 having a substrate holder 52 therein on which a substrate 54 is held.

In FIG. 12, hydrogen gas is flowed as a carrier gas for one of the precursors of indium gallium nitride. The other precursors may use conventional nitrogen gas or no carrier gas. Thus, a first flow 56 of trimethylgallium (TMG) in a nitrogen carrier gas is provided. A second flow of ethyldimethylindium (EdMIn) is provided in hydrogen as a carrier gas. It will also be understood that hydrogen and nitrogen or other carrier gases may be provided. A third flow 60 of ammonia (NH$_3$) is also provided. The embodiment of FIG. 12 may allow a minimization of the number of separate gas flows which are required. However, it may be more difficult to control the amount of hydrogen which is used, when it is combined with another precursor.

FIG. 13 illustrates an embodiment of a gas source MBE or MOCVD system wherein separate flows are used for the precursors of indium, gallium and nitrogen in non-hydrogen carrier gases, and hydrogen gas is flowed in a gas flow which is separate from the flows of the precursors. Thus, flow 56 includes TMG in nitrogen gas and flow 62 includes EdMIn in nitrogen. Flow 60 includes ammonia and flow 64 is a separate flow of hydrogen gas. It will be understood by those having skill in the art that other arrangements of the flow of precursor gases in the deposition chamber 50 may be provided. For example, hydrogen can be flowed with ammonia. If aluminum indium gallium nitride is being deposited, an aluminum precursor, such as trimethylaluminum is also provided, either separate from the flows shown in FIGS. 12-13 or incorporated into these flows.

Other organometallic precursors may also be used to provide the gallium, indium and aluminum. Example alternate precursors are triethylgallium (TEG) instead of trimethylgallium (TMG) for gallium; trimethylindium (TMI) instead of ethyldimethylindium (EdMIn) for indium; and triethylaluminum (TEA) instead of trimethylaluminum (TMA) for aluminum. Other organometallic sources for each element are well known to those of skill in the art.

The Table below illustrates gas flow rates which can be used to form indium gallium nitride films in a reactor shown in FIG. 13.

TABLE

| Precursors | Flow Rate |
| --- | --- |
| trimethylgallium (TMG, −10° C.) | ~2–4 μmole/min (1–2 sccm @ −10° C.) |
| ethyldimethylindium (EdMIn, +10° C.) | ~1–6.6 μmole/min (45–300 sccm @ +10° C.) |
| ammonia (NH$_3$, 100%) | ~2.05 × 10$^5$ μmole/min (5 slm) |
| hydrogen (H$_2$, 100%) | 0—10$^4$ μmole/min (0—250 sccm) |
| Carrier gas: nitrogen (N$_2$) | |

It will be understood that a particular MOCVD reactor typically has a "fingerprint" so that gas flows which are optimized for one MOCVD reactor may not necessarily be optimized for a different MOCVD reactor. This is due to the many reactor designs that exist. Temperature ranges for growing an aluminum nitride buffer layer may range from 400°–700° C., for growing a GaN layer may range from 900°–1100° C. and for growing InGaN layers may range from 830°–600° C.

Any one of several growth methods may be used to grow the thin quantum well layers. One method is conventional MOCVD in which the process gases flow into the growth chamber simultaneously. A second method is pulsed flow MOCVD (PFMOCVD) in which the organometallic process gases (TMG and EdMIn) are introduced into the growth chamber separately but with NH$_3$ flowing continuously. For PFMOCVD, the following parameters may have an effect on film quality and composition:

(1) the duration of the gallium and indium organometallic pulses, which may not be the same;

(2) the pause time between these pulses;

(3) the flow rate of each organometallic while it is pulsed; and (4) the total number of pulses, i.e. the layer thickness.

Pulse times and times between pulses over a range of 3 to 20 seconds have been investigated and total active layer growth times from 30 seconds to 10 minutes have also been tested.

A third growth method, which is a variation on PFMOCVD involves introducing pulses of the gallium and indium organometallics together rather than sequentially, into the chamber, followed by an off-time in which the organometallic flows are stopped but during which the NH$_3$ continues to flow. The time between pulses may enhance material quality by providing more time for migration of surface species to preferred lattice sites, and by allowing efficient removal of reaction products. The actual gas flow rates and temperature ranges used in the three techniques described above can be similar to those shown in the Table.

Figure 14:
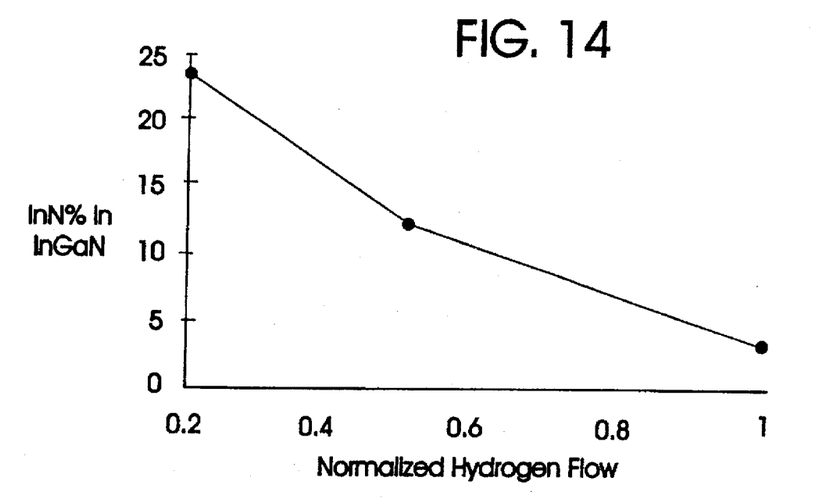
FIG. 14 graphically illustrates a relationship between hydrogen flow rate and indium incorporation for a particular MOCVD system.

According to the invention, hydrogen flow rate during the epitaxial growth of indium-containing nitride compounds has a dramatic effect on indium incorporation into the epitaxial films. It appears that higher hydrogen flow rates tend to reduce indium incorporation in the grown films, while lower hydrogen flow rates enable more indium to incorporate, as shown in FIG. 14. On the other hand, the absence of hydrogen during growth tends to produce films whose optical properties and surface morphologies are poor. While not wishing to be bound by any theory of operation, this degradation in film quality may be attributed to the presence of indium metal droplets which are segregated on the film surface, rather than indium being incorporated into the film as part of the alloy. This effect of hydrogen has been observed in both "bulk growth" of indium gallium nitride films and in the growth of thin indium gallium nitride quantum well layers.

In the reactor which was used, hydrogen flow rates of about $10^4$ μmole/min (about 250 sccm) are sufficient to nearly eliminate indium incorporation into indium gallium nitride films, while the absence of hydrogen creates films that are dark in color, presumably due to indium metal droplets, with poor optical properties. In one MOCVD reactor, optimum hydrogen flow is on the order of $10^3$ μmole/min (about 25 sccm) which gives sufficient indium incorporation in the alloy and excellent optical properties of the grown material.

As shown in FIG. 14, modulating the hydrogen flow alone may allow control of indium incorporation over a limited range. Other growth parameters, such as temperature and total organometallic flux may also play a role in growing indium gallium nitride alloys over the entire range of indium from 0 to 1. It also appears that lower growth temperatures may require higher hydrogen flow rates, and higher growth temperatures may require less hydrogen.

Figure 15:
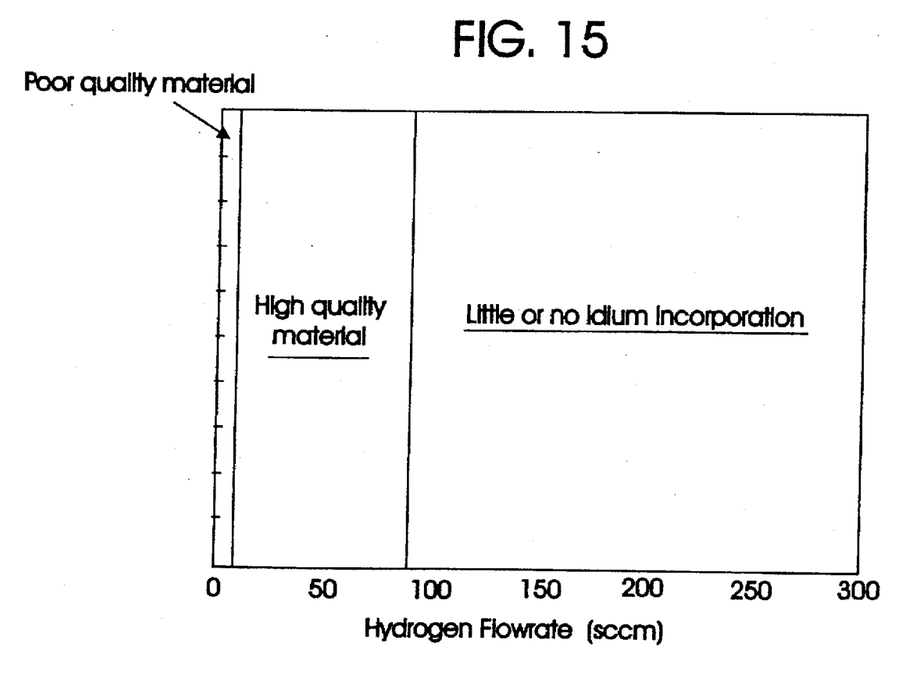
FIG. 15 graphically illustrates quality of indium gallium nitride or aluminum indium gallium nitride as a function of hydrogen flow rate for a particular MOCVD system.

FIG. 15 graphically illustrates the quality of the indium gallium nitride or aluminum indium gallium nitride as a function of hydrogen flow rate. As shown in FIG. 15, in this reactor at hydrogen flow rates less than about 4 sccm, $In_{0.1}Ga_{0.9}N$ films generally have poor surface morphology and poor optical properties. The films typically appear to be opaque and black to brown in color as seen by the naked eye, instead of clear to slightly pale yellow and translucent.

Continuing with the description of FIG. 15, for hydrogen flow rates between about 4 sccm and about 80 sccm, $In_xGa_{1-x}N$ films appear to have excellent optical properties and good surface morphology. $In_{0.65}Ga_{0.35}N$ quantum wells have been grown with excellent optical properties in this hydrogen flow rate range.

Finally, as shown in FIG. 15, for hydrogen flow rates greater than about 80 sccm, little or no indium incorporation is produced, regardless of indium precursor flow rates. These films typically have good surface morphology but exhibit gallium nitride near-band edge emission in photoluminescent measurements.

Accordingly, a controlled flow of hydrogen may be used to form indium gallium nitride or aluminum indium gallium nitride films having excellent optical and morphological properties and a high percentage of indium incorporation. This can improve the quality of all nitride-based semiconductor materials which include indium, including the stacked quantum well light emitting diodes of the present invention. It will be understood that the controlled hydrogen flow may be used in MOCVD, MBE, pulsed flow MOCVD and ALE types of deposition systems, and all other systems which form Indium Group III-V nitrides.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:
1. A quantum well light emitting diode comprising:
a first barrier layer comprising aluminum indium gallium nitride or aluminum gallium nitride;
a first active layer comprising indium gallium nitride on said first barrier layer;
a second barrier layer comprising aluminum indium gallium nitride or aluminum gallium nitride on said first active layer;
a second active layer comprising indium gallium nitride on said second barrier layer; and
a third barrier layer comprising aluminum indium gallium nitride or aluminum gallium nitride on said second active layer;
wherein said first active layer includes a first ratio of indium to gallium and wherein said second active layer includes a second ratio of indium to gallium which is different from said first ratio; and
wherein said first and second ratios are selected to produce corresponding first and second emission wavelengths from said first and second active layers, such that said first and second emission wavelengths combine to produce white light.

2. A light emitting diode according to claim 1 further comprising:
means for biasing said light emitting diode so that said first and second active layers produce corresponding first and second emission intensities and/or wavelengths.

3. A light emitting diode according to claim 1 wherein said first barrier layer is on a substrate.

4. A light emitting diode according to claim 3:
wherein said first active layer has a first ratio of indium to gallium and said second active layer has a second ratio of indium to gallium; and
wherein said first ratio is greater than said second ratio.

5. A light emitting diode according to claim 3 further comprising a buffer layer between said substrate and said first barrier layer.

6. A light emitting diode according to claim 5 further comprising a first cladding layer between said buffer layer and said first barrier layer.

7. A light emitting diode according to claim 6 further comprising a second cladding layer on said third barrier layer.

8. A quantum well light emitting diode comprising:
a first barrier layer comprising aluminum indium gallium nitride or aluminum gallium nitride;
a first active layer comprising indium gallium nitride on said first barrier layer;
a second barrier layer comprising aluminum indium gallium nitride or aluminum gallium nitrode on said first active layer;
a second active layer comprising indium gallium nitride on said second barrier layer; and
a third barrier layer comprising aluminum indium gallium nitride or aluminum gallium nitride on said second active layer;
a third active layer comprising indium gallium nitride or aluminum gallium nitride on said second active layer;
a third active layer comprising indium gallium nitride on said third barrier layer; and
a fourth barrier layer comprising aluminum nitride on said third barrier layer; and a fourth barrier layer comprising aluminum indium gallium nitride or aluminum gallium nitride on said third active layer;

wherein said first active layer includes a firs ratio of indium to gallium, wherein said second active layer includes a second ratio of indium to gallium, and wherein said third active layer includes a third ratio of indium to gallium, said first, second and third ratios being different from one another; and wherein said first, second and third ratios are selected to produce corresponding first, second and third emission wavelengths from said first, second and third active layers, such that said first, second and third emission wavelengths combine to produce white light.

9. A light emitting diode according to claim 8 further comprising:

means for biasing said light emitting diode so that said first, second and third active layers produce corresponding first, second and third emission intensities or wavelengths.

10. A light emitting diode according to claim 8 wherein said first barrier layer is on a substrate.

11. A light emitting diode according to claim 10 wherein said first barrier layer is doped a first conductivity type and wherein said fourth barrier layer is doped a second conductivity type.

12. A light emitting diode according to claim 10:

wherein said first active layer has a first ratio of indium to gallium, said second active layer has a second ratio of indium to gallium and said third active layer has a third ratio of indium to gallium; and wherein said first ratio is greater than said second ratio, and said second ratio is greater than said third ratio.

13. A light emitting diode according to claim 10 further comprising a buffer layer between said substrate and said first barrier layer.

14. A light emitting diode according to claim 13 further comprising a first cladding layer between said buffer layer and said first barrier layer.

15. A light emitting diode according to claim 14 further comprising a second cladding layer on said fourth barrier layer.

16. A quantum well light emitting diode comprising:

a first barrier layer comprising aluminum indium gallium nitrode or aluminum gallium nitrode;

a first active layer comprising indium gallium nitride on said first barrier layer;

a second barrier layer comprising aluminum indium gallium nitrode or aluminum gallium nitride on said first active layer;

a second active layer comprising indium gallium nitride on said second barrier layer;

a third barrier layer comprising aluminum indium gallium nitride or aluminum gallium nitride on said second active layer;

wherein said first active layer includes a first ratio of indium to gallium and wherein said second active layer includes a second ratio of indium to gallium which is different from said first ratio; and means for individually biasing said first and second active layers so that said first and second active layers produce corresponding first and second emission intensities or wavelengths which vary as a function of the individual bias on the first and second active layers.

17. A quantum well light emitting diode comprising:

a first barrier layer comprising aluminum indium gallium nitrode or aluminum gallium nitrode;

a first active layer comprising indium gallium nitride on said first barrier layer;

a second barrier layer comprising aluminum indium gallium nitrode or aluminum gallium nitrode on said first active layer;

a second active layer comprising indium gallium nitride on said second barrier layer; and a third barrier layer comprising aluminum indium gallium nitride or aluminum gallium nitride on said second active layer;

a third active layer comprising indium gallium nitride on said third barrier layer; and a fourth barrier layer comprising aluminum indium gallium nitride or aluminum gallium nitride on said third active layer;

wherein said first active layer includes a first ratio of indium to gallium, wherein said second active layer includes a second ratio of indium to gallium, and wherein said third active layer includes a third ratio of indium to gallium, said first, second and third ratios being different from one another; and means for individually biasing said first, second and third active layers so that said first, second and third active layers produce corresponding first, second and third emission intensities or wavelengths which vary as a function of the individual bias on the first, second and third active layers.

18. A quantum well light emitting diode comprising:

a first barrier layer comprising aluminum indium gallium nitride or aluminum gallium nitrode;

a first active layer comprising indium gallium nitride on said first barrier layer;

a second barrier layer comprising aluminum indium gallium nitride or aluminum gallium nitride on said first active layer;

a second active layer comprising indium gallium nitride on said second barrier layer; and a third barrier layer comprising aluminum indium gallium nitride or aluminum gallium nitride on said second active layer;

wherein said first active layer includes a first ratio of indium to gallium and wherein said second active layer includes a second ratio of indium to gallium which is different from said first ratio;

wherein said first barrier layer is on a substrate; and wherein said first barrier layer is doped a first conductivity type and wherein said third barrier layer is doped a second conductivity type.

19. A quantum well light emitting diode comprising:

a plurality of stacked active layers of indium gallium nitride, separated by barrier layers of aluminum indium gallium nitride or aluminum gallium nitride, wherein ratios of indium to gallium differ in at least two of said stacked active layers;

wherein the differing ratios of indium to gallium are selected to produce emission wavelengths from the stacked active layers, such that said emission wavelengths combine to produce white light.

20. A light emitting diode according to claim 19 further comprising:

means for biasing said light emitting diode so that said stacked active layers emit light.

21. A light emitting diode according to claim 19 further comprising:

means for individually biasing at least one of said stacked active layers so that the at least one of said stacked active layers emit light at intensities or wavelengths which vary as a function of the individual bias on the at least one of the stacked active layers.

22. A light emitting diode according to claim 19 wherein said plurality of stacked active layers of indium gallium nitride, separated by barrier layers of aluminum indium gallium nitride or aluminum gallium nitride are on a substrate.

23. A light emitting diode according to claim 22 further comprising a buffer layer between said substrate and said plurality of stacked active layers of indium gallium nitride, separated by barrier layers of aluminum indium gallium nitride or aluminum gallium nitride.

24. A light emitting diode according to claim 23 further comprising a cladding layer between said substrate and said plurality of stacked active layers of indium gallium nitride, separated by barrier layers of aluminum indium gallium nitride or aluminum gallium nitride.

25. A quantum well light emitting diode comprising:

a plurality of stacked active layers of indium gallium nitride, separated by barrier layers of aluminum indium gallium nitride or aluminum gallium nitride, wherein ratios of indium to gallium differ in at least two of said stacked active layers;

wherein said plurality of stacked active layers of indium gallium nitride separated by barrier layers of aluminum indium gallium nitride or aluminum gallium nitride, define first and second outer barrier layers; and wherein one of the outer barrier layers is doped a first conductivity type and the other of said outer barrier layers is doped a second conductivity type.

26. A quantum well light emitting diode comprising:

a plurality of stacked active layers of indium gallium nitride, separated by barrier layers of aluminum indium gallium nitride or aluminum gallium nitride, wherein ratios of indium to gallium differ in at least two of said stacked active layers;

wherein said plurality of stacked active layers of indium gallium nitride, separated by barrier layers of aluminum indium gallium nitride or aluminum gallium nitride are on a substrate; and wherein at least two of said plurality of stacked active layers of indium gallium nitride, separated by barrier layers of aluminum indium gallium nitride or aluminum gallium nitride, have decreasing ratios of indium to gallium from adjacent said substrate to opposite said substrate.

* * * * *